United States Patent
Liu et al.

(10) Patent No.: US 8,440,514 B2
(45) Date of Patent: May 14, 2013

(54) SEMICONDUCTOR DEVICE AND METHOD FOR MANUFACTURING THE SAME

(75) Inventors: Po-Wei Liu, Taichung (TW); Cheng-Tzung Tsai, Taipei (TW); Wen-Tai Chiang, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 434 days.

(21) Appl. No.: 12/101,725

(22) Filed: Apr. 11, 2008

(65) Prior Publication Data
US 2009/0256160 A1    Oct. 15, 2009

(51) Int. Cl.
*H01L 21/8234* (2006.01)

(52) U.S. Cl.
USPC ............ 438/197; 438/299; 438/303; 438/305

(58) Field of Classification Search .................. 438/197, 438/585, 289, 290, 291, 301, 303, 305, 306; 257/E21.409
See application file for complete search history.

(56) References Cited

U.S. PATENT DOCUMENTS

| | | | |
|---|---|---|---|
| 5,793,090 | A | 8/1998 | Gardner et al. |
| 6,297,811 | B1 | 10/2001 | Kent et al. |
| 7,217,627 | B2 | 5/2007 | Kim |
| 7,550,336 | B2 | 6/2009 | Hsiao |
| 2006/0134872 | A1* | 6/2006 | Hattendorf et al. ........... 438/300 |
| 2007/0008299 | A1 | 1/2007 | Hristov |

OTHER PUBLICATIONS

Article titled " Strained Si Channel MOSFETs with Embedded Silicon Carbon Formed by Solid Phase Epitaxy " authored by Liu et al., 2007 Symposium on VISI Technology Digest of Technical Papers, pp. 44-45.

Yaocheng Liu et al., "Strained Si channel MOSFETs with Embedded Silicon Carbon Formed by Solid Phase Epitaxy", 2007, p. 44-45, IBM T.J. Watson Research Center, Yorktown Heights, NY 10598, USA.

Setsuhara, Y. ; Miyake, S. ; Kumagai, M. ; Kyoh, B., Formation of β-SiC thin layers by implantation of carbon ions into silicon using MEVVA ion source, Ion Implantation Technology Proceedings, 1998 International Conference on, Dec. 1999, p. 1090-1092, vol. 2, Conference Publications.

King-Jien Chui, Kah-Wee Ang ; Narayanan Balasubramanian ; Ming-Fu Li ; Ganesh S. Samudra ; Yee-Chia Yeo, n-MOSFET With Silicon-Carbon Source/Drain for Enhancement of Carrier Transport, Electron Devices, IEEE Transactions on, Feb. 2007, p. 249-256, vol. 54 , Issue 2, IEEE Electron Devices Society.

* cited by examiner

*Primary Examiner* — Jack Chen
(74) *Attorney, Agent, or Firm* — Ding Yu Tan (57) ABSTRACT

A method for manufacturing a semiconductor device is provided. A gate structure is formed on a substrate. A first dopant implantation and a first strain atom implantation are performed. Thereafter, spacers are formed on sidewalls of the gate structure. A second dopant implantation and a second strain atom implantation are performed. A solid-phase epitaxy annealing process is performed to form source and drain regions made of a semiconductor compound solid-phase epitaxial layer beside the gate structure.

7 Claims, 9 Drawing Sheets

SEMICONDUCTOR DEVICE AND METHOD FOR MANUFACTURING THE SAME

BACKGROUND OF THE INVENTION

1. Field of the Invention

The present invention relates to an integrated circuit structure and a method for manufacturing the same, and more particularly to a semiconductor device and a manufacturing method thereof.

2. Description of Related Art

In the field of integrated circuit devices, the dimensions of the devices are often reduced to attain a higher operating speed and a lower power consumption. However, with the ever-increasing level of integration of devices, the miniaturization of devices has almost reached its limit. Hence, other means of reducing device dimensions are required to increase the operating speed and reduce the power consumption. Therefore, how to increase the driving current and avoid forming defects in the device has long been an issue under study.

One proposed solution to overcoming the limitations imposed by device miniaturization includes controlling the strain in the channel region of a transistor. A method for strain control is utilizing materials having an identical crystal structure but different lattice constants to achieve the purpose of controlling the strain. If a transistor is an N-type transistor, implanted strain atom are carbon atom and formed into an epitaxial structure of silicon carbide (SiC). Since the lattice constant of carbon atoms is usually smaller than that of silicon atoms, if SiC is embedded in source and drain regions, a tensile stress can be generated in the channel to enhance the mobility of electrons so that the driving current of the device is increased. If a transistor is a P-type transistor, implanted strain atom are germanium and formed into an epitaxial structure of silicon germanium (SiGe). A compression stress can be generated in the channel to enhance the mobility of holes.

Currently, there is one method in which the predetermined source and drain regions are removed in the substrate by an etching process to form a trench and then a epitaxial material layer is deposited therein. However, since the solid solubility of strain atoms in silicon crystals is quite low, the concentration of a semiconductor compound solid-phase epitaxy layer formed by the strain atoms is very low. Moreover, in this method, more than half of the strain atoms are located on the interstitial sites in the crystal, instead of the substitutional sites.

Currently, the company IBM proposes a solid-phase epitaxy (SPE) process. An N-type transistor is exemplified herein. High-concentration carbon atoms are implanted into source and drain regions, and then SiC is formed therein by a solid-phase epitaxy annealing process. As pointed out by IBM, in the method, not only are more carbon atoms located on the substitutional sites, but the annealing process required by implanting the carbon atoms can also be completed altogether when SiC is epitaxy grown by a subsequent solid-phase epitaxy process. One annealing process is thereby omitted.

The manner of strain control utilized in the channel region of the transistor is related to a surface concentration of the strain atoms. Generally, strain atoms with a higher concentration on the substrate surface at the two sides of the gate structure would create a stronger strain (tensile stress or compression stress) and thereby increasing the driving current. Nevertheless, the method proposed by IBM to implant high-concentration carbon atoms at one time is very likely to cause defects on the surface of the source and drain regions and trigger leakage even though the required concentration of the SiC solid-phase epitaxy layer on the surface of the source and drain regions can be thus obtained.

SUMMARY OF THE INVENTION

The present invention is directed to a method for manufacturing a semiconductor device by implanting strain atoms two or a plurality of times. Not only can the required surface concentration of the strain atoms be achieved, but the defects can also be prevented from forming on the surface of the source and drain regions and other problems derived therefrom.

The present invention further provides a semiconductor device. In a channel region of a transistor, strain control is applied to increase a driving current therein and thereby enhancing the reliability and performance of the semiconductor device.

The present invention provides a method for manufacturing a semiconductor device. The method includes forming a gate structure on a substrate and performing a solid-phase expitaxy process to form a semiconductor compound solid-phase epitaxy layer respectively at two sides of the gate structure. The solid-phase epitaxy process includes a first strain atom implantation and a second strain atom implantation having different energies so as to form strain regions respectively at two sides of the gate structure in the substrate. The solid-phase expitaxy process further includes performing a solid-phase epitaxy annealing process so that each strained region forms a semiconductor compound solid-phase epitaxy layer.

According to an embodiment of the present invention, the strain atoms implanted by the first and the second strain atom implantations are carbon atom. The semiconductor compound solid-phase epitaxy layer is a SiC solid-phase epitaxy layer.

According to an embodiment of the present invention, the said solid-phase epitaxy annealing process is an annealing process performed at 400° C. to 900° C. under an nitrogen atmosphere for 1-2 hours.

According to an embodiment of the present invention, the strain atoms implanted by the first and the second strain atom implantations are germanium. The semiconductor compound solid-phase epitaxy layer is a SiGe solid-phase epitaxy layer.

According to an embodiment of the present invention, the said manufacturing method of the semiconductor device, after forming the gate structure and before performing the solid-phase epitaxy annealing process, further includes performing a first stage process in sequence. The first stage process includes a first dopant implantation so as to form doped source and drain extension regions respectively at two sides of the gate structure in the substrate. Afterwards, spacers are formed on sidewalls of the gate structure. Then, a second stage process is performed including a second dopant implantation so as to form doped source and drain contact regions respectively in the substrate at two sides of the gate structure and the spacers.

According to an embodiment of the present invention, the first and the second strain atom implantations are both implemented in the first stage process.

According to an embodiment of the present invention, the first strain atom implantation is performed in the first stage process and the second strain atom implantation is performed in the second stage process.

According to an embodiment of the present invention, the first and the second strain atom implantations are both implemented in the second stage process.

According to an embodiment of the present invention, the method for manufacturing the semiconductor device further includes performing a pre-morphization implantation during the first or the second stage process.

According to an embodiment of the present invention, the method for manufacturing the semiconductor device further includes forming spacers on sidewalls of the gate structure in sequence after forming the gate structure and before performing a solid-phase epitaxy process. Then, a second stage process is performed including a second dopant implantation so as to form doped source and drain contact regions respectively in the substrate at two sides of the gate structure and the spacers. Afterwards, the spacers are removed. Then, the first stage process is performed including a first dopant implantation so as to form doped source and drain extension regions respectively at two sides of the gate structure in a substrate.

According to an embodiment of the present invention, the first and the second strain atom implantations both implemented in the second stage process.

According to an embodiment of the present invention, the first strain atom implantation is performed in the first stage process and the second strain atom implantation is performed in the second stage process.

According to an embodiment of the present invention, the first and the second strain atom implantations are both implemented in the first stage process.

According to an embodiment of the present invention, the method for manufacturing the semiconductor device further includes performing a pre-morphization implantation during the first or the second stage process.

According to an embodiment of the present invention, in the method for manufacturing the semiconductor device, a dosage of the first strain atom implantation is different from a dosage of the second strain atom implantation.

According to an embodiment of the present invention, in the method for manufacturing the semiconductor device, a dosage of the first strain atom implantation is the same as a dosage of the second strain atom implantation.

According to an embodiment of the present invention, the manufacturing method of the semiconductor device further includes, before a solid-phase epitaxy annealing process, performing at least one third strain atom implantation. An energy of the third strain atom implantation is between an energy of the first strain atom implantation and an energy of the second strain atom implantation.

The present invention further provides a semiconductor device including a substrate, a gate structure, two first semiconductor compound solid-phase epitaxy layers and two second semiconductor compound solid-phase epitaxy layers. The two first semiconductor compound solid-phase epitaxy layers are respectively disposed at two sides of the gate structure in the substrate. The two second semiconductor compound solid-phase epitaxy layers are respectively disposed under each of the first semiconductor compound solid-phase epitaxy layers in the substrate. A concentration of the strain atoms in the second semiconductor compound solid-phase epitaxy layer is lower than that in the first semiconductor compound solid-phase epitaxy layer.

According to an embodiment of the present invention, two doped source and drain extension regions in the semiconductor device are respectively disposed in the first semiconductor compound solid-phase epitaxy layer.

According to an embodiment of the present invention, two source and drain contact doped regions in the semiconductor device are respectively disposed in the second semiconductor compound solid-phase epitaxy layer.

According to an embodiment of the present invention, in the semiconductor device, the first semiconductor compound solid-phase epitaxy layer and the second semiconductor compound solid-phase epitaxy layer are SiC solid-phase epitaxy layers and the strain atoms are carbon.

According to an embodiment of the present invention, in the semiconductor device, the first semiconductor compound solid-phase epitaxy layer and the second semiconductor compound solid-phase epitaxy layer are SiGe solid-phase epitaxy layers and the strain atoms are germanium.

The present invention utilizes a method of implanting strain atoms two or a plurality of times to form a more uniform semiconductor compound solid-phase epitaxy layer. Therefore, not only is the high strain (tensile stress or compression stress) of the source and drain regions maintained, but surface defects are also significantly reduced. In the meantime, the energy, dosage and sequence of the implanted strain atoms may be adjusted to meet the requirements of the process. The present invention is a highly flexible and competitive invention.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the present invention, a solid-phase epitaxy (SPE) process is utilized to form a semiconductor compound solid-phase epitaxy layer having a strain (tensile stress or compression stress) so as to achieve strain control. The SPE process includes a first strain atom implantation and a second strain atom implantation with energies different from each other so as to form strain regions at two sides of a gate structure in a substrate. Afterwards, a solid-phase epitaxy annealing process is performed so that the strain atoms in the strain regions epitaxy grow into a semiconductor compound solid-phase epitaxy layer.

Figure 1:
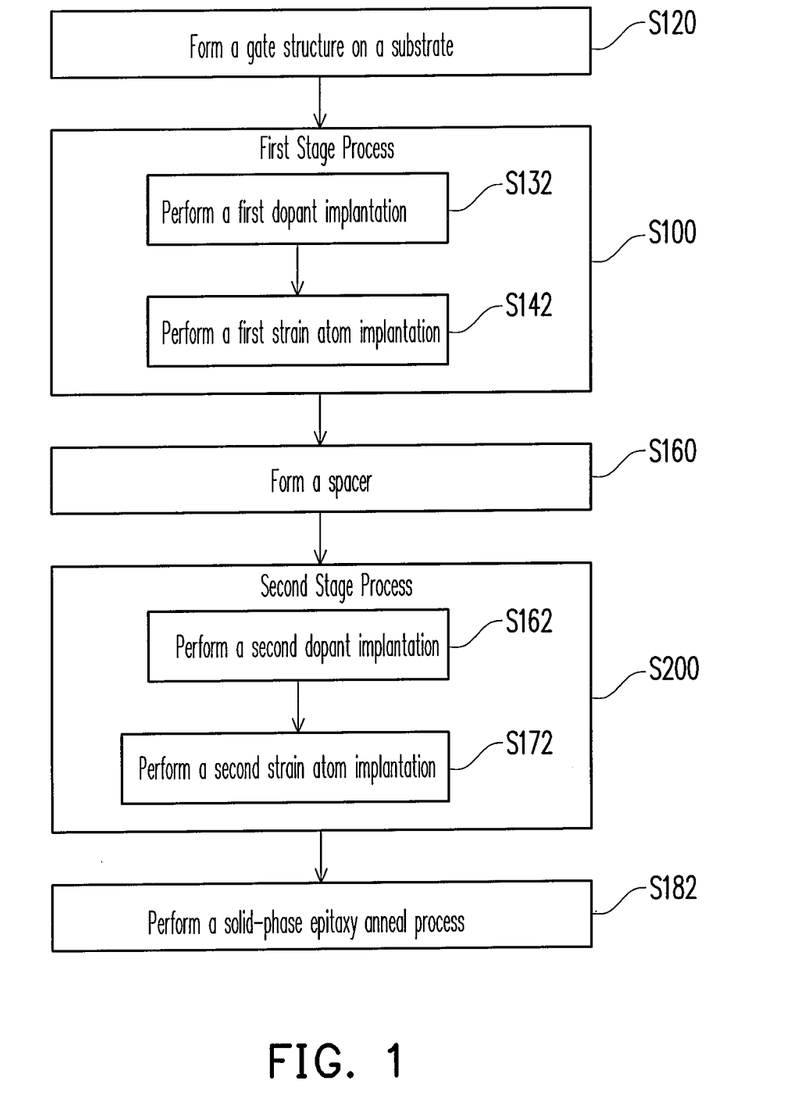
FIG. 1 illustrates a flowchart according to the first embodiment of the present invention.

FIG. 1 is a flowchart of manufacturing a semiconductor device according to the first embodiment of the present invention. FIGS. 1A through 1G are schematic cross-sectional views illustrating a process flow of manufacturing a semiconductor device according to the first embodiment of the present invention.

Figure 1A:
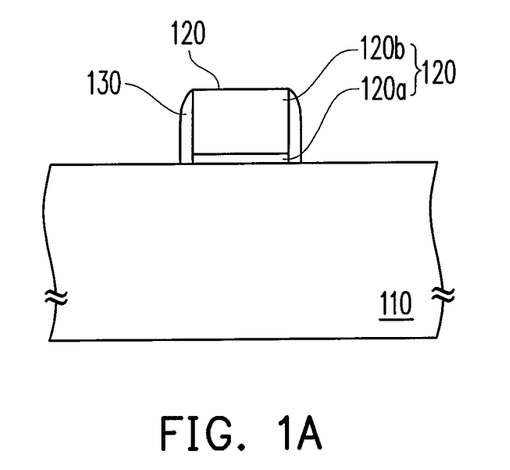
FIGS. 1A through 1G are schematic cross-sectional views illustrating a flowchart of manufacturing a semiconductor device according to the first embodiment of the present invention.

First, referring to FIGS. 1 and 1A, a step S120 is performed to form a gate structure 120 on a substrate 110. The substrate 110 is, for example, a bulk Si substrate or a semiconductoron-insulator (SOI) substrate. The SOI substrate is constituted by a substrate, an insulation layer and a semiconductor layer stacked from bottom to top, for example. A method for forming the gate structure 120 is forming sequentially a dielectric layer (not illustrated) and a conductive layer (not illustrated) on the substrate 110. Afterwards, a patterning process is performed to define the conductive layer and the dielectric layer so that a gate 120b and a gate dielectric layer 120a are formed. A material of the gate 120b is polysilicon, metal or polycide, for example. A material of the gate dielectric layer 120a is, for example, silicon oxide, silicon nitride or silicon oxynitride. The material may also be a dielectric layer material with a high dielectric constant, such as $Al_2O_3$, $Y_2O_3$, $ZrSi_xO_y$, $HfSi_xO_y$, $La_2O_3$, $ZrO_2$, $HfO_2$, $Ta_2O_5$, $Pr_2O_3$ or $TiO_2$.

Thereafter, offset spacers 130 may be optionally formed on sidewalls of the gate structure 120. A material of the offset spacers 130 is silicon oxide or other suitable materials, for example. A method for forming the offset spacers 130 is, for example, forming a spacer material layer (not illustrated) on the gate structure 120 by a thermal oxidation process.

Figure 1B:
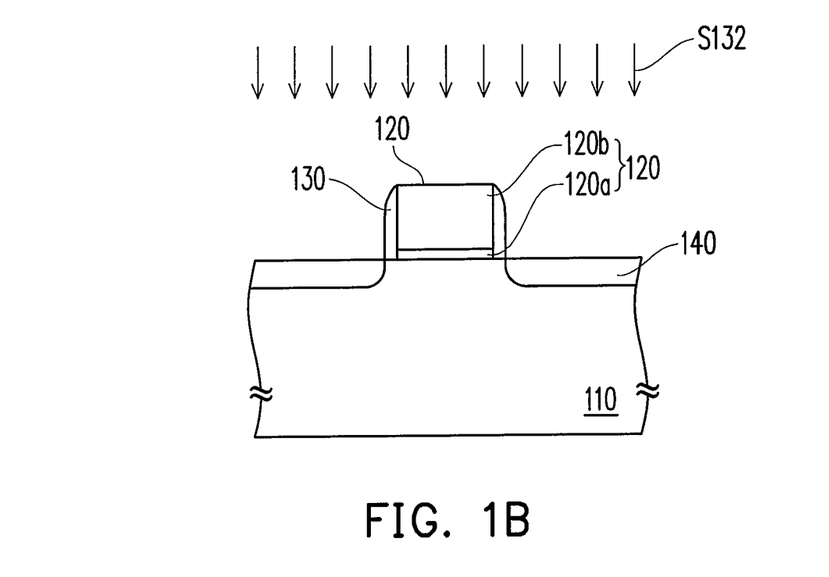
Figure 1C:
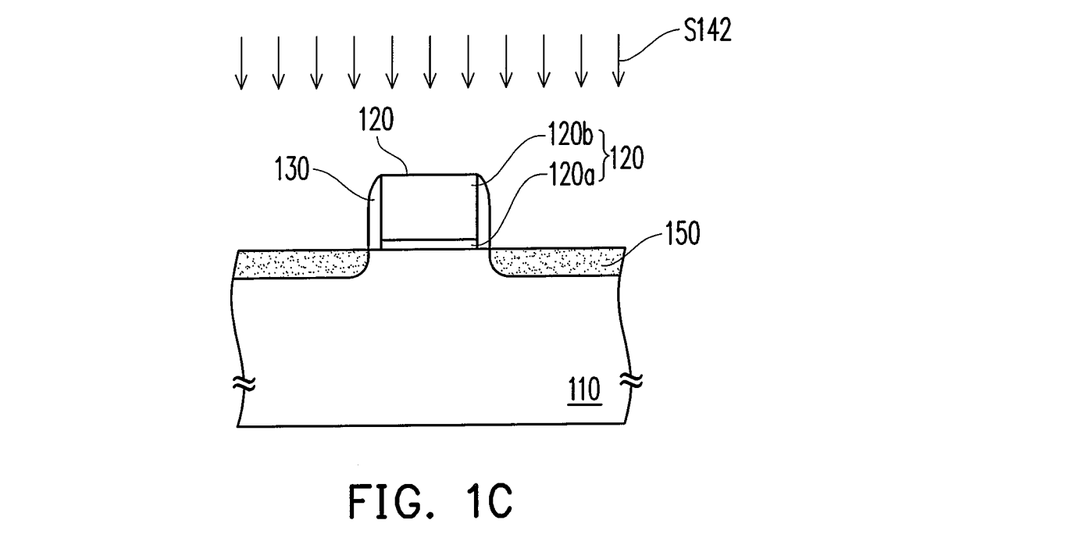

Afterwards, referring to FIGS. 1, 1B and 1C, a first stage process S100 is performed including a first dopant implantation S132 and a first strain atom implantation S142.

In the present embodiment, during the first stage process S100 as illustrated in FIG. 1B, the first dopant implantation S132 is performed first to form doped source and drain extension regions 140 at two sides of the gate structure 120 in the substrate 110. When manufacturing an N-type transistor, the ion utilized in the first dopant implantation S132 is an N-type dopant such as phosphorous or arsenic. When manufacturing a P-type transistor, the ion utilized in the first dopant implantation S132 is a P-type dopant such as boron or boron fluoride.

Next, referring to FIGS. 1 and 1C, during the first stage process S100, after the first dopant implantation S132, the first strain atom implantation S142 is continued to form two doped strained source and drain extension regions 150 at the two sides of the gate structure 120 in the substrate 110. When manufacturing an N-type transistor, the implanted strain atom used in the first strain atom implantation S142 is, for example, carbon. When manufacturing a P-type transistor, the implanted strain atom used in the first strain atom implantation S142 is, for example, germanium.

In the present invention, the first stage process S100 may include all the processes utilizing the same mask as the first dopant implantation. Besides the first dopant implantation S132 and the first strain atom implantation S142, the process S100 may further include a pre-amorphization implantation (PAI) and a co-implantation (not illustrated). The atom implanted by the pre-amorphization implantation is germanium, for example. Furthermore, an atom implanted by the co-implantation is, for example, carbon with low dosage so as to define a junction profile.

Figure 1D:
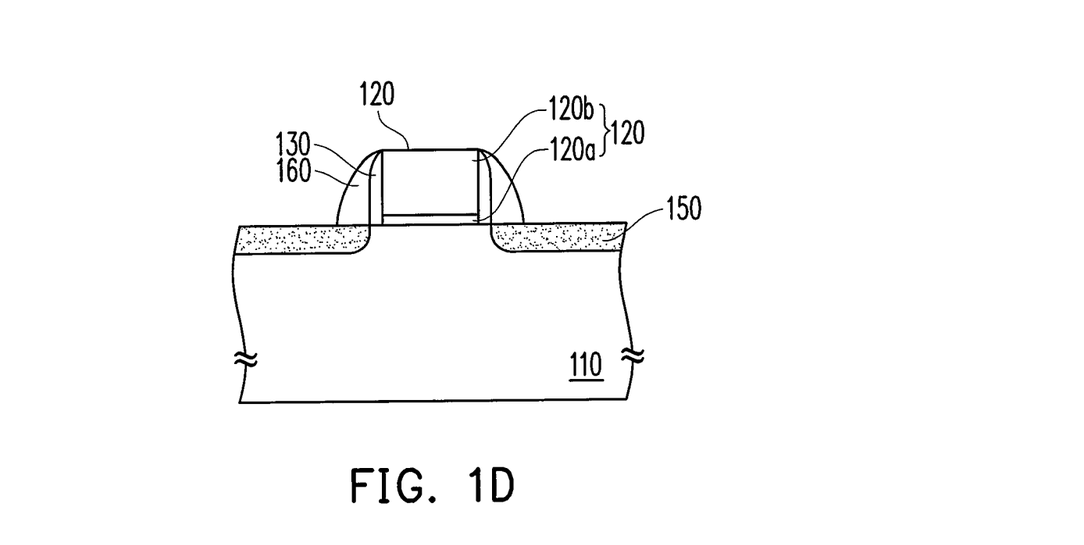

After that, referring to FIGS. 1 and 1D, a step S130 is performed to form spacers 160 on sidewalls of the offset spacers 130. A material of the spacers 160 is silicon oxynitride, silicon oxide or other suitable materials, for example. A method for forming the spacers 160 is, for example, forming a spacer material layer (not illustrated) on the gate structure 110 by a chemical vapor deposition (CVD) process first and then a portion of the spacer material layer is removed by an anisotropic etching process. The spacers 160 may be different structures containing a single layer or a plurality of layers. In the drawings, only one single layer is illustrated to represent the spacers 160.

Figure 1E:
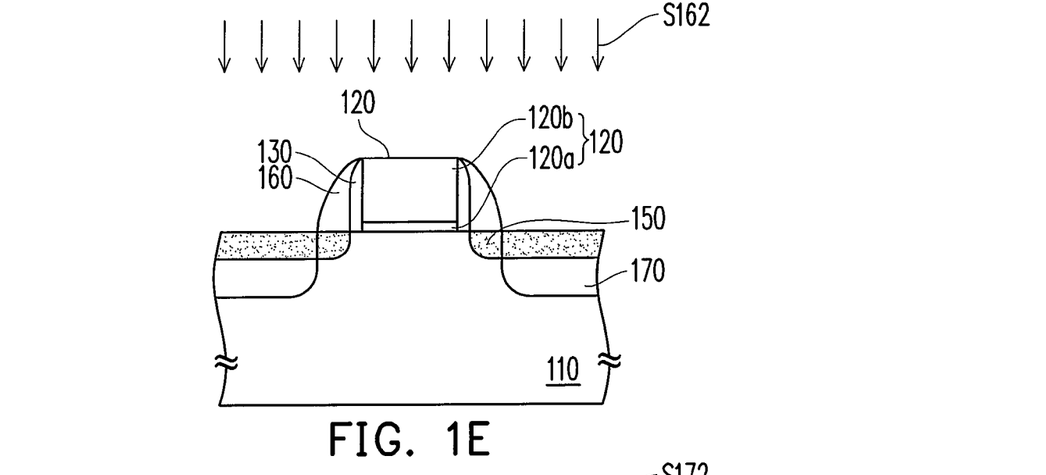
Figure 1F:
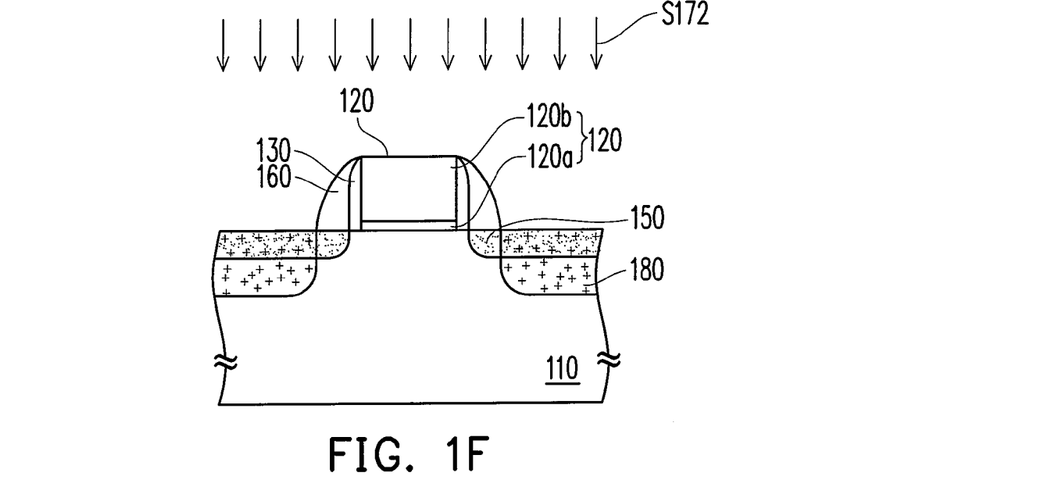

Next, referring to FIGS. 1, 1E and 1F, a second stage process S200 is performed including a second dopant implantation S162 and a first strain atom implantation S172.

In the present embodiment, during the first stage process S100 as illustrated in FIG. 1B, the first dopant implantation S162 is performed first to form doped source and drain contact regions 170 at two sides of the spacers 160 in the substrate 110. When manufacturing an N-type transistor, the ion utilized is an N-type dopant such as phosphorous or arsenic. When manufacturing a P-type transistor, the ion utilized is a P-type dopant such as boron or boron fluoride.

Next, referring to FIGS. 1 and 1F, during the second stage process S200, after completing the second dopant implantation S162, a second strain atom implantation S172 is continued to form doped strained source and drain extension regions 180 at two sides of the spacers 160 in the substrate 110. When manufacturing an N-type transistor, the implanted strain atom used in the second strain atom implantation S172 is, for example, carbon. When manufacturing a P-type transistor, the implanted strain atom used in the second strain atom implantation S172 is, for example, germanium.

In the present invention, the second stage process S200 may include all the processes utilizing the same mask as the second dopant implantation. Besides the second dopant implantation S162 and the second strained atom implantation S172, the process S200 may further include a pre-amorphization implantation (PAI) and a co-implantation (not illustrated). The atom implanted by the pre-amorphization implantation is germanium, for example. Furthermore, an atom implanted by the co-implantation is, for example, carbon with low dosage so as to define a junction profile.

Figure 1G:
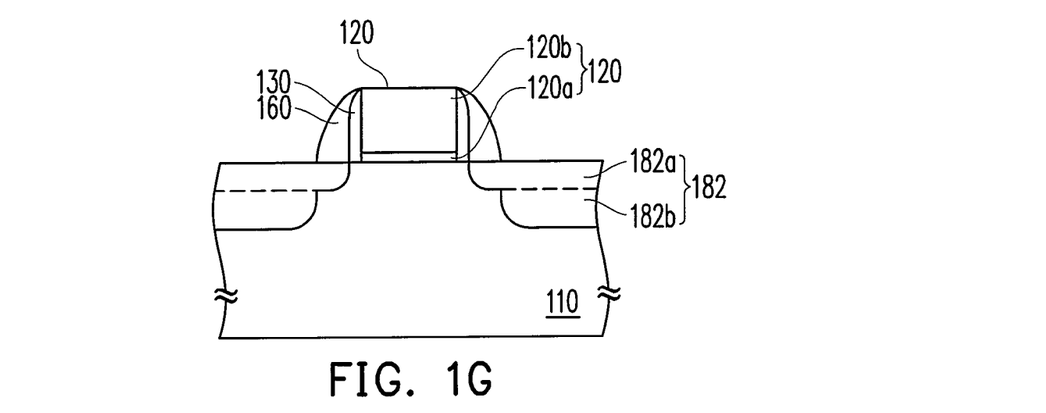

Thereafter, referring to FIGS. 1 and 1G, a step S182 is performed to proceed with a solid-phase epitaxy annealing process so that the strain atoms in the doped strained source and drain extension regions 150 and the doped strained source and drain contact regions 180 react with the silicon atoms in the substrate to form a semiconductor compound solid-phase epitaxy layer 182 as a source and drain regions.

When manufacturing an N-type transistor, the formed semiconductor compound solid-phase epitaxy layer is, for example, SiC, which generates a tensile stress. When manufacturing a P-type transistor, the formed semiconductor compound solid-phase epitaxy layer is, for example, SiGe, which generates a tensile stress. Specifically, a temperature and a period of the solid-phase epitaxy annealing process are different from those of the conventional ion implantation annealing process. The solid-phase epitaxy annealing process S182 has a lower temperature and a longer period of time. The implanted strain atoms of the first and second dopant implantations not only react with the silicon atoms in the substrate to form a semiconductor compound solid-phase epitaxy layer, but the implanted ions of the first and second dopant implantations are simultaneously activated and diffused as the source and drain regions.

Next, referring to FIG. 1G, in the present embodiment, through controlling the energy and dosage of the first and second strain atom implantations S142 and S172, the formed semiconductor compound solid-phase epitaxy layer 182 is divided into two regions according to a concentration distribution of the strain atoms. One of the regions is a semiconductor compound solid-phase epitaxy layer 182a having a higher concentration of strain atoms near a surface of the source and drain regions 182. The other region is a semiconductor solid-phase epitaxy layer 182b having a lower concentration of strain atoms far away from the surface of the source and drain regions 182. An interface between the semiconductor compound solid-phase epitaxy layers 182a and 182b is illustrated with a dotted line. The dotted line in FIG. 1G is intended to illustrate and not to limit the present invention. A location of the dotted line is not necessarily on a level of a horizontal junction between the source and drain extension region and the source and drain contact region. The said location may be adjusted according to a Gaussian distribution of the strain atoms having different energies and dosages.

The energy of the first strain atom implantation S142 is different from that of the second strain atom implantation S172. However, the dosage of the first strain atom implantation S142 may be smaller than, equal to or larger than that of the second strain atom implantation S172.

In an embodiment of the present invention, the implanted strain atom is carbon, the energy of the first strain atom implantation S142 is about 1-2 KeV and the dosage is about $3 \times 10^{14}$-$1 \times 10^{15}$ atom/cm$^2$. The energy of the second strain atom implantation S172 is about 6-8 KeV and the dosage is about $5 \times 10^{14}$-$3 \times 10^{15}$ atom/cm$^2$. Implantation angles of the first and the second strain atom implantations S142 and 172 are between 0° and 30°, for example. The solid-phase epitaxy annealing process S182 is performed at a temperature about 400 to 800° C. under an nitrogen atmosphere for about 1-2 hours.

Moreover, the first strain atom implantation S142 in the first stage process S100 is not necessarily performed after the first dopant implantation. The first strain atom implantation may also be performed before the first dopant implantation S132. Likewise, the second strain atom implantation S172 in the second stage process S200 is not necessarily performed after the second dopant implantation S162. The second strain atom implantation S172 may also be performed before the second dopant implantation S162. TABLE 1 shows the different fabrication sequences according to the second through tenth embodiments of the present invention.

Figure 2:
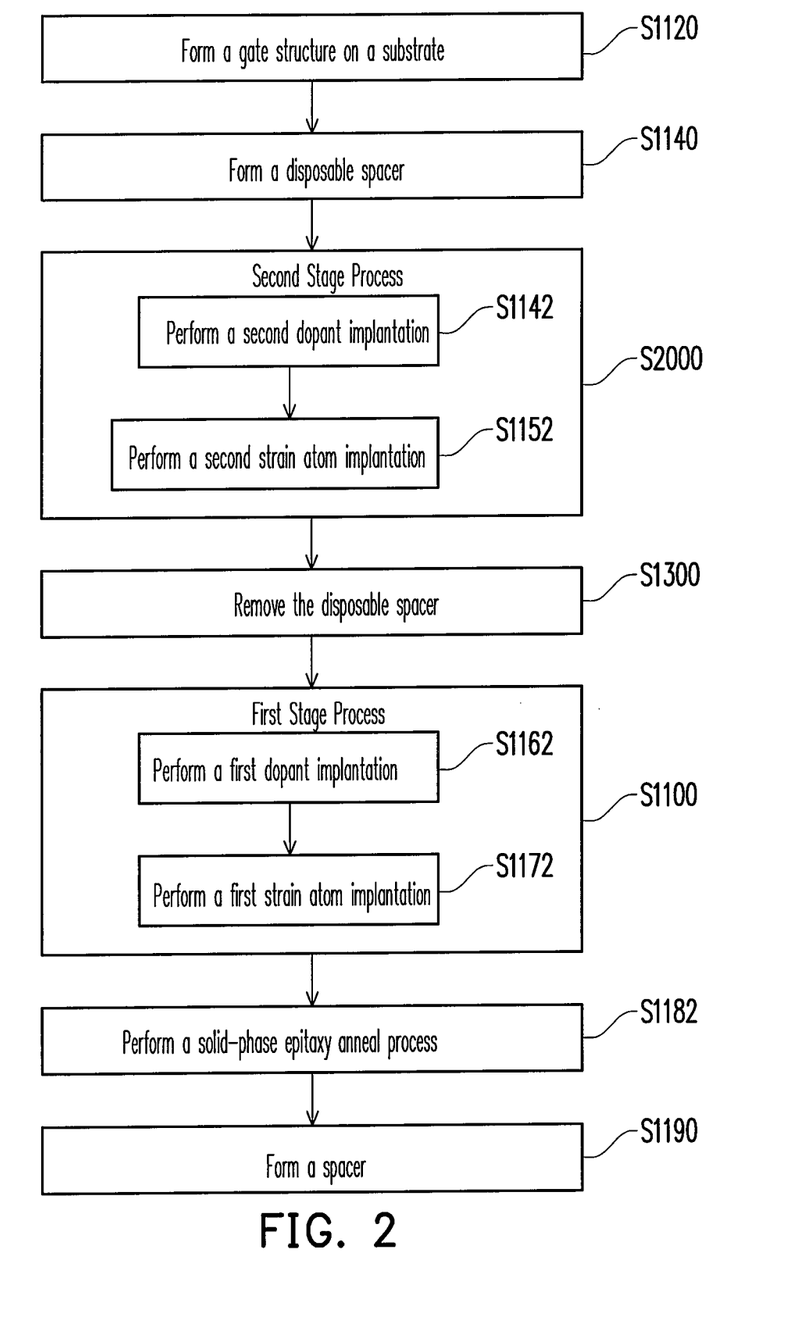
FIG. 2 illustrates a flowchart according to the eleventh embodiment of the present invention.

FIG. 2 illustrates a flowchart of manufacturing a semiconductor device according to the eleventh embodiment of the present invention. FIGS. 12A-2I are schematic cross-sectional views illustrating a process flow of manufacturing a semiconductor device according to the eleventh embodiment of the present invention.

Figure 2A:
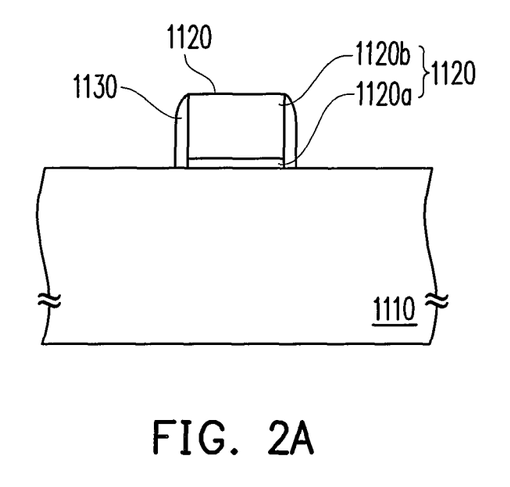
FIGS. 2A through 2I are schematic cross-sectional views illustrating a flowchart of manufacturing a semiconductor device according to the second embodiment of the present invention.

First, referring to FIGS. 2 and 2A, a step S1120 is performed to form a gate structure 1120 on a substrate 1110.

Then, offset spacers 1130 may be optionally formed on sidewalls of the gate structure 1120.

Figure 2B:
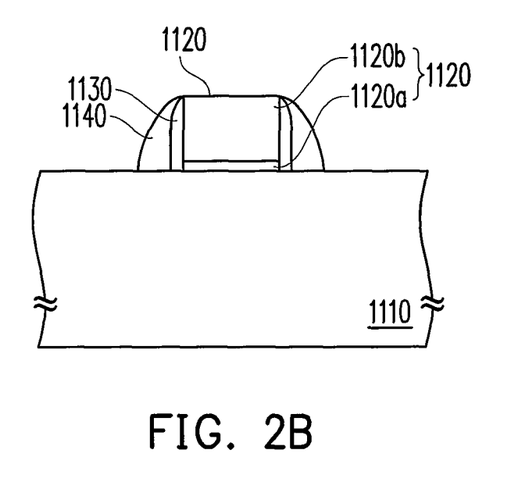

After that, referring to FIGS. 2 and 2B, a step S1140 is performed to form disposable spacers 1140 on sidewalls of the offset spacers 1130. A material of the disposable spacers 1140 is silicon oxynitride, silicon oxide or other suitable materials, for example. A method for forming the disposable spacers 1140 is, for example, forming a spacer material layer (not illustrated) on the structure 1110 by a chemical vapor deposition process first and then a portion of the spacer material layer is removed by an anisotropic etching process.

Figure 2C:
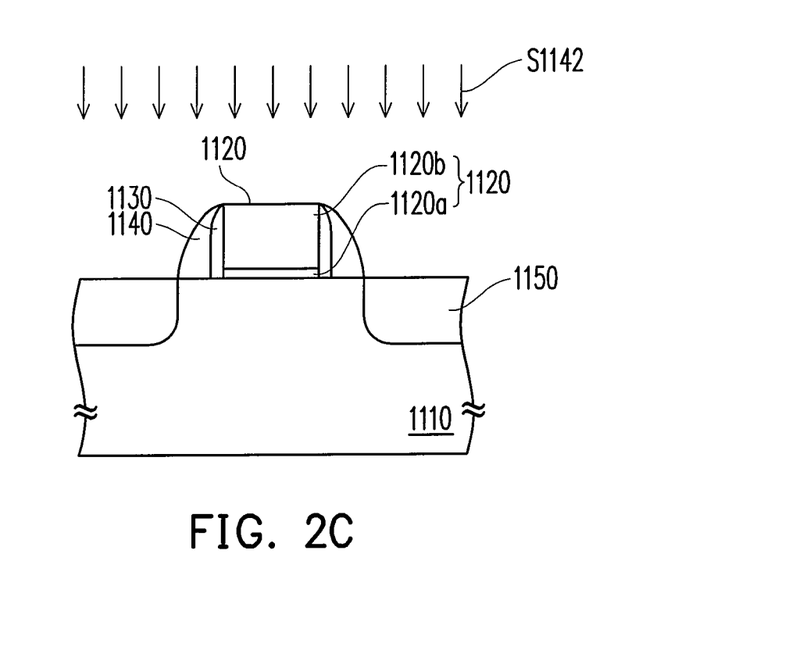
Figure 2D:
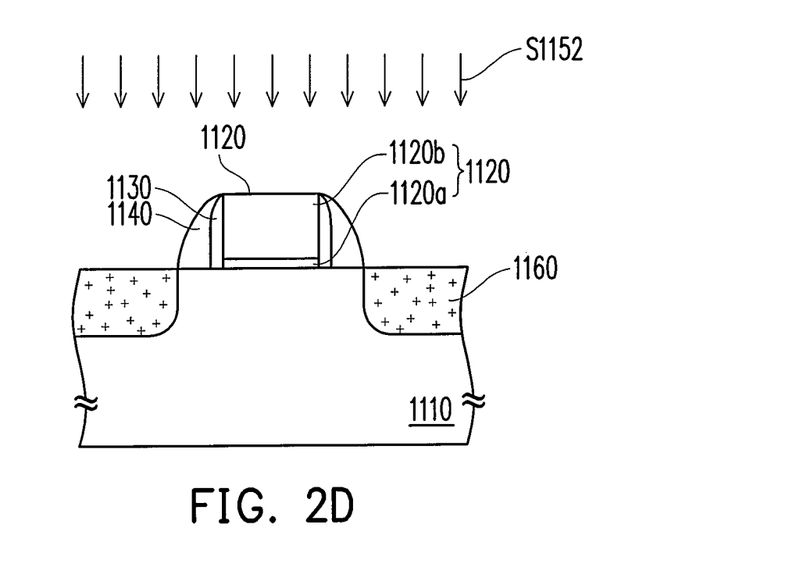

Next, referring to FIGS. 2, 2C and 2D, a second stage process S2000 is performed including a second dopant implantation S1142 and a second strain atom implantation S1152.

In the present embodiment, during the second stage process S2000 as illustrated in FIG. 2C, the second dopant implantation S1142 is performed first to form doped source and drain contact regions 1150 at two sides of the disposable spacers 1140 in the substrate 1110.

Next, referring to FIGS. 2 and 2D, during the second stage process S2000, after completing the second dopant implantation, the second strain atom implantation S1152 is continued to form doped strained source and drain contact regions 1160 at the two sides of the disposable spacers 1140 in the substrate 1110.

TABLE 1

| Step | Sequence | | | | | | | | | |
|---|---|---|---|---|---|---|---|---|---|---|
| | 1$^{st}$ Embodiment | 2$^{nd}$ embodiment | 3$^{rd}$ embodiment | 4$^{th}$ embodiment | 5$^{th}$ embodiment | 6$^{th}$ embodiment | 7$^{th}$ embodiment | 8$^{th}$ embodiment | 9$^{th}$ embodiment | 10$^{th}$ embodiment |
| Form a gate structure on a substrate | 1 | 1 | 1 | 1 | 1 | 1 | 1 | 1 | 1 | 1 |
| Perform a first dopant implantation | 2F | 3F | 2F | 3F | 2F | 4F | 3F | 2F | 2F | 2F |
| Perform a first strain atom implantation | 3F | 2F | 3F | 2F | 3F | 2F | 2F | 5S | 4S | 4S |
| Form a spacer | 4 | 4 | 4 | 4 | 5 | 5 | 5 | 3 | 3 | 3 |
| Perform a second dopant implantation | 5S | 5S | 6S | 6S | 6S | 6S | 6S | 4S | 6S | 5S |
| Perform a second strain atom implantation | 6S | 6S | 5S | 5S | 4F | 3F | 4F | 6S | 5S | 6S |
| Perform a solid-phase epitaxy annealing process | 7 | 7 | 7 | 7 | 7 | 7 | 7 | 7 | 7 | 7 |

Note:
F donates the first stage process;
S donates the second stage process

In all of the above-mentioned embodiments illustrated in FIGS. 1 through 10, after the gate structure is formed on the substrate, the first stage process is implemented first including all the processes utilizing the same mask as the first dopant implantation and then spacers are formed. Thereafter, the second stage process is implemented including all the processes utilizing the same mask as the second dopant implantation. Finally, a solid-phase epitaxy annealing process is performed. However, the sequence of the first and the second stage processes S100 and S200 may be exchanged. A detailed description is provided hereinafter. The methods and materials of the following embodiments are same with or similar to those of the above-mentioned embodiments; thus, the unnecessary details are not given herein.

In the present invention, the second stage process S2000 may include all the processes utilizing the same mask as the second dopant implantation S1142. Besides the second dopant implantation S1142 and the strained atom implantations S1152, the second process S2000 may further include a pre-amorphization implantation (PAI) and a co-implantation (not illustrated).

Figure 2E:
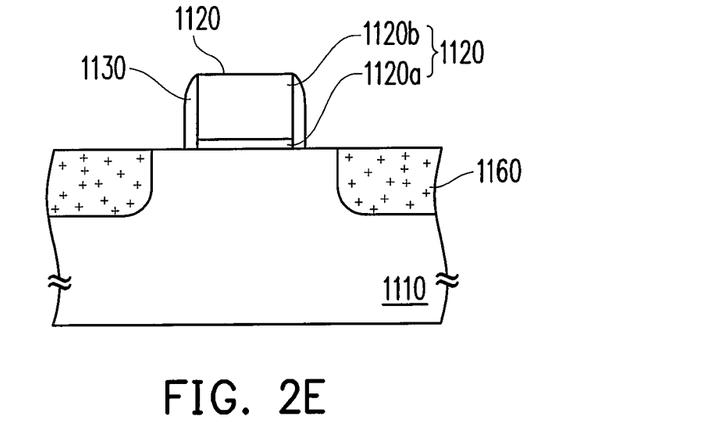

Next, referring to FIGS. 2 and 2E, a step S1300 is performed to remove the disposable spacers 1140. The disposable spacers 1140 are removed, for example, by a wet etching process.

Figure 2F:
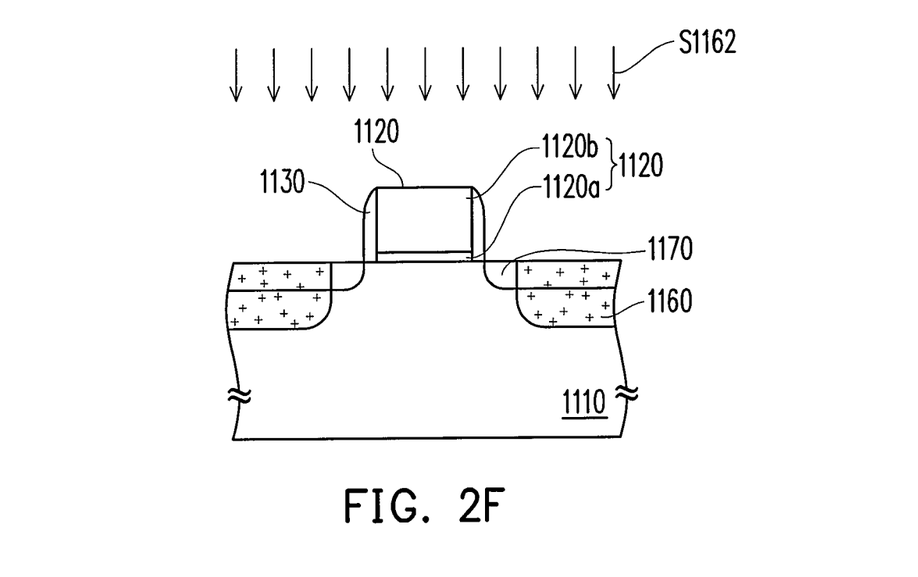
Figure 2G:
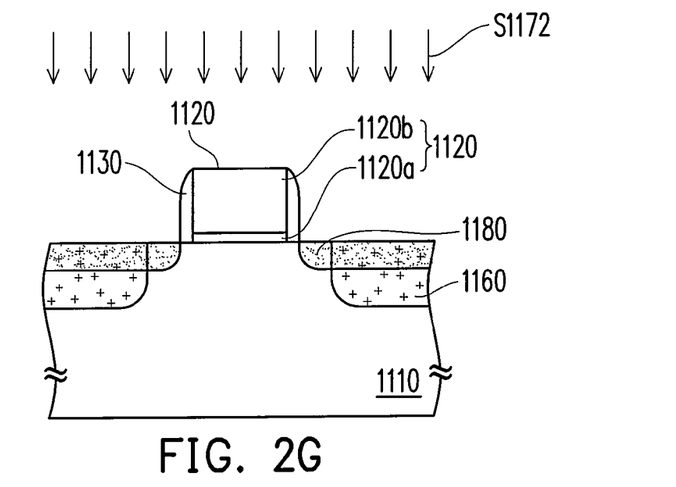

Afterwards, referring to FIGS. 2, 2F and 2G, a first stage process S1100 is performed including a first dopant implantation S1162 and a first strain atom implantation S1172.

In the present embodiment, during the first stage process S1100 as illustrated in FIG. 2F, the first dopant implantation S1162 is performed first to form doped source and drain extension regions 1170 at two sides of the gate structure 1120 in the substrate 1110.

Next, referring to FIGS. 2 and 2G, during the first stage process S1100, after completing the first dopant implantation S1162, the first strain atom implantation S1172 is continued to form doped strained source and drain extension regions 1180 at two sides of the gate structure 1120 in the substrate 1110. The aforementioned source and drain extension regions and the source and drain contact regions are combined as the source and drain regions.

In the present invention, the first stage process S1100 may include all the processes utilizing the same mask as the first dopant implantation S1162. Besides the first dopant implantation S1162 and the strained atom implantations S1172, the first stage process S1100 may further include a pre-amorphization implantation (PAI) and a co-implantation (not illustrated).

Figure 2H:
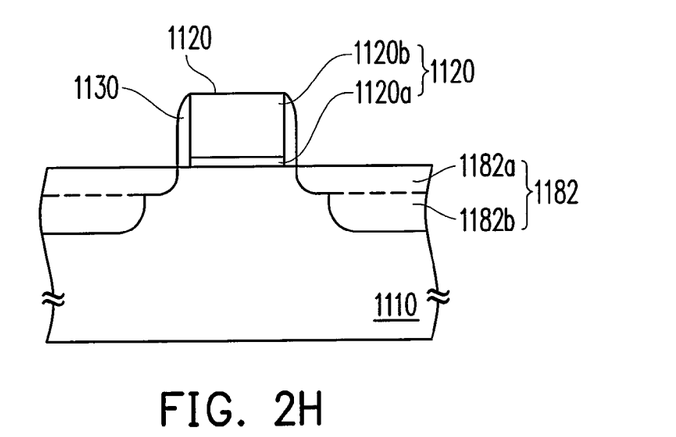
Figure 2I:
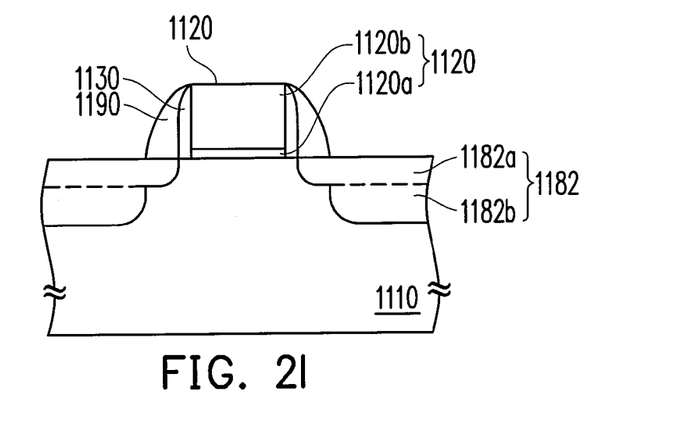

Afterwards, referring to FIGS. 2 and 2H, a step S1182 is implemented to perform a solid-phase epitaxy annealing process so that the strain atoms in the doped strained source and drain extension regions 1180 and the doped strained source and drain contact regions 1160 react with the silicon atoms in the substrate to form a semiconductor compound solid-phase epitaxy layer 1182 as the source and drain regions.

Next, referring to FIG. 2H, in the present embodiment, through controlling the energy and dosage of the first and second strain atom implantations S1172 and S1152, the formed semiconductor compound solid-phase epitaxy layer 1182 is divided into two regions according to a concentration distribution of the strain atoms. One of the regions is a semiconductor compound solid-phase epitaxy layer 1182a having a higher concentration of strain atoms near a surface of the source and drain regions. The other region is a semiconductor solid-phase epitaxy layer 1182b having a lower concentration of strain atoms far away from the surface of the source and drain regions. An interface between the semiconductor compound solid-phase epitaxy layers 1182a and 1182b is illustrated with a dotted line. The dotted line in FIG. 2H is intended to illustrate and not to limit the present invention. A location of the dotted line is not necessarily on a level of a horizontal junction between the source and drain extension regions and the source and drain contact regions. The said location may be adjusted according to a Gaussian distribution of the strain atoms of different energies and dosages.

Thereafter, referring to FIGS. 2 and 2I, a step S1190 is performed to form spacers 1190 on sidewalls of the offset spacer 1130. Furthermore, the steps S1190 and S1182 may also be exchanged. The step S1190 may be performed first to form the spacers 1190 at the sidewalls of the offset spacers 1130 and then the step S1182 is implemented to perform a solid-phase epitaxy annealing process.

The energy of the first strain atom implantation S1172 is different from that of the second strain atom implantation S1152. However, the dosage of the first strain atom implantation S1172 may be smaller than, equal to or larger than that of the second strain atom implantation S1152.

Moreover, the first strain atom implantation S1172 in the first stage process S1100 is not necessarily performed after the first dopant implantation S1162. The first strain atom implantation S1172 may also be performed before the first dopant implantation S1162. Likewise, the second strain atom implantation S1152 in the second stage process S2000 is not necessarily performed after the second dopant implantation S1142. It may also be performed beforehand. A detailed description is provided in TABLE 2.

TABLE 2

| Step | Sequence | | | | | | | | | |
|---|---|---|---|---|---|---|---|---|---|---|
| | 11$^{th}$ Embodiment | 12$^{th}$ embodiment | 13$^{th}$ embodiment | 14$^{th}$ embodiment | 15$^{th}$ embodiment | 16$^{th}$ embodiment | 17$^{th}$ embodiment | 18$^{th}$ embodiment | 19$^{th}$ embodiment | 20$^{th}$ embodiment |
| Form a gate structure on a substrate | 1 | 1 | 1 | 1 | 1 | 1 | 1 | 1 | 1 | 1 |
| Form a disposable spacer | 2 | 2 | 2 | 2 | 2 | 2 | 2 | 2 | 2 | 2 |
| Perform a second dopant implantation | 3S | 4S | 3S | 4S | 3S | 5S | 4S | 3S | 3S | 3S |
| Perform a second strain atom implantation | 4S | 3S | 4S | 3S | 4S | 3S | 3S | 6F | 5F | 5F |
| Remove the disposable spacer | 5 | 5 | 5 | 5 | 6 | 6 | 6 | 4 | 4 | 4 |
| Perform a first dopant implantation | 6F | 6F | 7F | 7F | 7F | 7F | 7F | 5F | 7F | 6F |
| Perform a first strain atom implantation | 7F | 7F | 6F | 6F | 5S | 4S | 5S | 7F | 6F | 7F |
| Perform a solid-phase epitaxy annealing process | 8 | 8 | 8 | 8 | 8 | 8 | 8 | 8 | 8 | 8 |
| Form a spacer | 9 | 9 | 9 | 9 | 9 | 9 | 9 | 9 | 9 | 9 |

Note:
F donates the first stage process;
S donates the second stage process

In the above-mentioned embodiments, although two strain atom implantations with different energies are cited as examples to illustrate the solid-phase epitaxy process, the examples are not intended to limit the present invention. A third strain atom implantation may also be added into the solid-phase epitaxy process of the present invention. The energy and dosage of the third strain atom implantation are between those of the first strain atom implantation and those of the second strain atom implantation. In another embodiment of the present invention, when the implanted strain atom is carbon atom, the energy of the added third strain atom implantation is about 2-6 KeV and the dosage thereof is about $3 \times 10^{14}$-$2 \times 10^{15}$ atom/cm$^2$.

According to the descriptions of the embodiments disclosed in the present invention, the strain (tensile stress or compression stress) corresponding to the concentration distribution of the semiconductor compound solid stage epitaxy layer can be adjusted according to two or a plurality of strain atom implantations with different energies and dosages.

According to the descriptions of the embodiments disclosed in the present invention, the two or the plurality of strain atom implantations with different energies and dosages may be performed before or after forming the spacer layer so that the flexibility of the process is enhanced.

Besides the advantages of high flexibility mentioned above, the present invention has another feature of reduced surface defects. By implanting strain atoms two or a plurality of times, a more uniform semiconductor compound solid-phase epitaxy layer is formed in the present invention, and the high-concentration strain atoms also remain on the surface of the substrate at the two sides of the gate structure thereby generating a greater strain (tensile stress or compression stress) to increase the driving current. Furthermore, since the energy and dosage of the strain atoms implanted each time are not too high, the surface defects are significantly reduced. Hence, the method of implanting high-concentration strain atoms into the source and drain regions at one single time is avoided because even though the said method can achieve the desired concentration of the semiconductor compound solid-phase epitaxy layer, it is very easy to cause defects on the surface of the source and drain regions and incur leakage.

In the meantime, the annealing process for the two or a plurality of different strain atom implantations and the first and second dopant implantations may all be completed altogether with the solid-phase epitaxy annealing process for the semiconductor compound solid-phase epitaxy layer. No additional annealing process is required.

In addition, the semiconductor compound solid-phase epitaxy layer formed in the present invention is a crystal structure with a more uniform concentration distribution. Reduced reliability and poor performance caused by a dropped concentration of the strain atoms is therefore avoided.

In conclusion, the present invention has the advantages of maintaining the high strain (tensile stress or compression stress) in the source and drain regions, reducing defects on the surface, increasing the reliability and performance of the device and providing a highly flexible process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for manufacturing a semiconductor device, comprising:
    forming a gate structure on a substrate;
    performing a first dopant implantation so as to form doped source and drain extension regions respectively at the two sides of the gate structure in the substrate;
    forming spacers on sidewalls of the gate structure;
    performing a second dopant implantation so as to form doped source and drain contact regions respectively at the two sides of the gate structure in the substrate;
    performing a first strain atom implantation in the substrate at two sides of the gate structure;
    performing a second strain atom implantation in the substrate at two sides of the gate structure, wherein the first and second strain atom implantations are performed with different energies, and the first and second strain atom implantation form strained regions at two sides of the gate structure, wherein the first strain atom implantation is performed between performing the first dopant implantation for forming the doped source and drain extension regions and forming the spacers, and the second strain atom implantation is performed between forming the spacers and performing the second dopant implantation for forming the doped source and drain contact regions; and
    performing an annealing process so that each strained region forms a semiconductor compound layer.

2. The method for manufacturing the semiconductor device as claimed in claim 1, wherein the first strain atom implantation and the second strain atom implantation implant carbon atoms and the semiconductor compound layer is a silicon carbide (SiC) layer.

3. The method for manufacturing the semiconductor device as claimed in claim 2, wherein the annealing process is performed at 400'C to 900° C. under a nitrogen atmosphere for 1-2 hours.

4. The method for manufacturing the semiconductor device as claimed in claim 1, wherein the first and second strain atom implantations are performed with the same dopants.

5. A method for manufacturing a semiconductor device, comprising:
    forming a gate structure on a substrate;
    performing a first dopant implantation in the substrate;
    forming spacers on sidewalls of the gate structure;
    performing a second dopant implantation in the substrate;
    performing a first strain atom implantation in the substrate;
    performing a second strain atom implantation in the substrate, wherein the first and second strain atom implantations are performed with different energies, and the first and second strain atom implantations form strained regions at two sides of the gate structure, wherein the first strain atom implantation is performed between performing the first dopant implantation for forming the doped source and drain extension regions and forming the spacers, and the second strain atom implantation is performed between forming of the spacers and the second dopant implantation for forming the doped source and drain contact regions; and
    performing an annealing process so that each strained region forms a semiconductor compound layer.

6. The method for manufacturing a semiconductor device of claim 5, wherein the first strain atom implantation and the second strain atom implantation implant carbon atoms and the semiconductor compound layer is a silicon carbide (SiC) layer.

7. The method for manufacturing a semiconductor device of claim 6, wherein the annealing process is performed at 400° C. to 900° C. under a nitrogen atmosphere for 1-2 hours.

* * * * *